US011953531B2

(12) United States Patent
Holland et al.

(10) Patent No.: US 11,953,531 B2
(45) Date of Patent: Apr. 9, 2024

(54) SENSE RESISTOR AND METHOD FOR FORMING SAME

(71) Applicant: Cirrus Logic International Semiconductor Ltd., Edinburgh (GB)

(72) Inventors: Kathryn R. Holland, Cedar Park, TX (US); Bo-Ren Wang, Austin, TX (US); Ravi K. Kummaraguntla, Austin, TX (US); Graeme G. Mackay, Austin, TX (US); Christian Larsen, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 357 days.

(21) Appl. No.: 17/118,330

(22) Filed: Dec. 10, 2020

(65) Prior Publication Data

US 2021/0364560 A1 Nov. 25, 2021

Related U.S. Application Data

(60) Provisional application No. 63/027,576, filed on May 20, 2020.

(51) Int. Cl.
*G01R 27/02* (2006.01)
*H01C 1/14* (2006.01)
(Continued)

(52) U.S. Cl.
CPC .............. *G01R 27/02* (2013.01); *H01C 1/14* (2013.01); *H01C 1/16* (2013.01); *H01C 17/00* (2013.01)

(58) Field of Classification Search
CPC . G01R 27/02; H01C 1/14; H01C 1/16; H01C 17/00
See application file for complete search history.

(56) References Cited

U.S. PATENT DOCUMENTS 3,289,276 A * 12/1966 Wasyluk .................. H01C 7/18
  361/779
3,536,997 A * 10/1970 Holt ....................... G01R 27/02
  341/157
(Continued)

FOREIGN PATENT DOCUMENTS

CN       104779429       *  7/2015  ............... G01R 1/70
CN       110784140 A        2/2020
(Continued)

OTHER PUBLICATIONS

Stmicroelectronics NV, AN4218—Hardware design guideline power supply and voltage measurement—Application Note, Doc ID 024014 Rev 3, 26 pages, Oct. 2015.
(Continued)

*Primary Examiner* — Alexander Satanovsky
*Assistant Examiner* — Sharah Zaab
(74) *Attorney, Agent, or Firm* — Jackson Walker L.L.P.

(57) ABSTRACT

An apparatus may include a sense resistor comprising a plurality of parallel-coupled resistor elements, a plurality of positive voltage sense points, and a plurality of negative voltage sense points. A first passive combination network may be configured to combine the plurality of positive voltage sense points into a single positive sense terminal and a second passive combination network may be configured to combine the plurality of negative voltage sense points into a single negative sense terminal. The first passive combination network and the second passive combination network may be arranged such that a sense voltage is measurable between the single positive sense terminal and the single negative sense terminal and a dependence of the sense voltage on a variation in current density in the parallel-coupled resistor elements is minimized.

16 Claims, 4 Drawing Sheets

(51) Int. Cl.
  *H01C 1/16* (2006.01)
  *H01C 17/00* (2006.01)

(56) References Cited

U.S. PATENT DOCUMENTS

| | | | |
|---|---|---|---|
| 3,680,028 A * | 7/1972 | Black | H01C 1/14 |
| | | | 338/308 |
| 5,248,524 A | 9/1993 | Soderlund | |
| 5,617,016 A | 4/1997 | Borghi et al. | |
| 5,757,167 A * | 5/1998 | Arora | G05F 1/59 |
| | | | 323/224 |
| 6,177,783 B1 | 6/2001 | Donohue | |
| 6,597,158 B2 | 7/2003 | Umeda | |
| 7,102,340 B1 * | 9/2006 | Ferguson | H05B 41/3927 |
| | | | 323/284 |
| 7,190,150 B2 | 3/2007 | Chen et al. | |
| 7,906,939 B2 | 3/2011 | Kung et al. | |
| 9,088,247 B2 | 7/2015 | Arno et al. | |
| 9,577,587 B2 | 2/2017 | Maru et al. | |
| 9,639,102 B2 | 5/2017 | Dally | |
| 9,742,393 B2 | 8/2017 | Pavao-Moreira et al. | |
| 10,263,523 B1 | 4/2019 | Sonntag et al. | |
| 10,476,392 B1 | 11/2019 | Matsuura et al. | |
| 10,673,423 B2 | 6/2020 | Forghani-Zadeh et al. | |
| 10,720,835 B2 | 7/2020 | King et al. | |
| 10,734,885 B2 | 8/2020 | King et al. | |
| 2001/0020802 A1 | 9/2001 | Kitagawa et al. | |
| 2005/0264268 A1 | 12/2005 | Ueno | |
| 2006/0139819 A1 | 6/2006 | May | |
| 2006/0249822 A1 * | 11/2006 | DeBeer | G01R 1/203 |
| | | | 257/676 |
| 2008/0129219 A1 | 6/2008 | Smith et al. | |
| 2008/0278136 A1 | 11/2008 | Murtojarvi | |
| 2009/0266397 A1 | 10/2009 | Gibson et al. | |
| 2010/0019702 A1 | 1/2010 | Jang et al. | |
| 2010/0085034 A1 * | 4/2010 | Sakayori | G01R 19/0092 |
| | | | 361/56 |
| 2010/0156175 A1 | 6/2010 | Wei | |
| 2011/0075446 A1 | 3/2011 | Doutreloigne et al. | |
| 2011/0121653 A1 | 5/2011 | Hartular et al. | |
| 2011/0227497 A1 * | 9/2011 | Hu | H05B 45/385 |
| | | | 315/224 |
| 2012/0205974 A1 | 8/2012 | McCaslin et al. | |
| 2012/0268094 A1 | 10/2012 | Scaldaferri et al. | |
| 2013/0106188 A1 | 5/2013 | Ishibashi et al. | |
| 2014/0197814 A1 | 7/2014 | Shi et al. | |
| 2016/0064986 A1 | 3/2016 | Langlinais et al. | |
| 2017/0005647 A1 | 1/2017 | Pan et al. | |
| 2017/0072812 A1 | 3/2017 | Von Novak et al. | |
| 2019/0181754 A1 | 6/2019 | Ash et al. | |
| 2019/0245444 A1 | 8/2019 | Kimura | |
| 2020/0235712 A1 | 7/2020 | May et al. | |
| 2021/0083578 A1 | 3/2021 | King et al. | |
| 2021/0159798 A1 | 5/2021 | Mackay et al. | |
| 2021/0364560 A1 | 11/2021 | Holland et al. | |
| 2021/0367510 A1 | 11/2021 | Lawrence et al. | |
| 2021/0367513 A1 | 11/2021 | Mackay et al. | |
| 2021/0367514 A1 | 11/2021 | Lawrence et al. | |
| 2021/0367515 A1 | 11/2021 | Mackay et al. | |
| 2021/0367517 A1 | 11/2021 | Lawrence et al. | |

FOREIGN PATENT DOCUMENTS

| | | |
|---|---|---|
| EP | 1919058 A2 | 5/2008 |
| EP | 2775599 A1 | 9/2014 |
| EP | 3214746 A1 | 9/2017 |
| EP | 3240171 A1 | 11/2017 |
| FR | 2851091 A1 | 8/2004 |
| GB | 2555902 A | 5/2018 |
| TW | 201228201 A | 7/2012 |
| WO | 2012135778 A1 | 10/2012 |
| WO | 2017027393 A1 | 2/2017 |
| WO | 2019135820 A1 | 7/2019 |

OTHER PUBLICATIONS

Freescale Semiconductor, Inc., Multimedia Applications Division, i.MX233 Power Management Unit and Battery Charger—Application Note, Document No. AN3883, Rev. 0, 36 pages, Jul. 2009.

Texas Instruments, TPS6128x Low-, Wide-Voltage Battery Front-End DC/DC Converter Single-Cell Li-Ion, Ni-Rich, Si-Anode Applications—Data sheet, SLVSBI1A, 57 pages, Oct. 2013, Revised Sep. 2014.

Texas Instruments, Designing Robust TPS65217 Systems for VIN Brownout—Application Report, 13 pages, Oct. 2017.

Renesas Electronics Corporation, Preventing Subsystem Brownouts in Mobile Devices—White Paper, 6 pages.

MFJ Enterprises, Inc., MFJ—Super Battery Booster—Model MFJ-4416C—Instruction Manual, Version 0A, 16 pages, 2017.

International Search Report and Written Opinion of the International Searching Authority, International Application No. PCT/US2020/056782, dated Mar. 4, 2021.

Van Vroonhoven, Caspar, A 0-to-60V-Input Vcm Coulomb Counter with Signal-Dependent Supply Current and ±0.5% Gain Inaccuracy from -50° C. to 125° C., 2020 IEEE International Solid-State Circuits Conference, Feb. 19, 2020.

International Search Report and Written Opinion of the International Searching Authority, International Application No. PCT/US2021/029631, dated Jul. 23, 2021.

Qiu et al., "Digital Average Current-Mode Control of PWM DC-DC Converts without Current Sensors", IEEE Transactions on Industrial Electronics, IEEE Service Center, vol. 57, No. 5, May 10, 2010, Piscataway, NJ, USA.

International Search Report and Written Opinion of the International Searching Authority, International Application No. PCT/US2021/029584, dated Jul. 30, 2021.

International Search Report and Written Opinion of the International Searching Authority, International Application No. PCT/US2021/032474, dated Aug. 3, 2021.

Vinnikov et al., "Solar Optiverter—A Novel Hybrid Approach to the PHotovoltaic Module Level Power Electronics", IEEE Transactions on Industrial Electronics, IEEE Service Center, vol. 66, No. 5, May 1, 2019, pp. 3869-3880, Piscataway, NJ, USA.

International Search Report and Written Opinion of the International Searching Authority, International Application No. PCT/US2021/032496, dated Aug. 4, 2021.

International Search Report and Written Opinion of the International Searching Authority, International Application No. PCT/US2021/030932, dated Aug. 20, 2021.

International Search Report and Written Opinion of the International Searching Authority, International Application No. PCT/US2021/039356, dated Oct. 1, 2021.

International Search Report and Written Opinion of the International Searching Authority, International Application No. PCT/US2020/047237, dated Oct. 30, 2020.

Stala, Robert et al., "A Switched-Capacitor DC-DC Converter with Variable Number of Voltage Gains and Fault-Tolerant Operation", IEEE Transactions on Industrial Electronics, IEEE Service Center, Piscataway, NJ, US, vol. 66, No. 5, May 1, 2019.

International Search Report and Written Opinion of the International Searching Authority, International Application No. PCT/US2021/039373, dated Sep. 22, 2021.

Yu, Yangwei: "Choosing the Boost with Bypass or Pass Through", Jun. 30, 2017, Retrieved from the Internet Sep. 10, 2021.

Texas Instruments: TPS61291 Loe IQ Boost Converter with Bypass Operation, Sep. 30, 2014, Retrieved from the Internet Sep. 10, 2021.

International Search Report and Written Opinion of the International Searching Authority, International Application No. PCT/US2020/039509, dated Oct. 8, 2021.

International Search Report and Written Opinion of the International Searching Authority, International Application No. PCT/US2020/041535, dated Oct. 14, 2021.

Search Report under Section 17, UKIPO, Application No. GB2106142.9, dated Oct. 20, 2021.

(56) References Cited

OTHER PUBLICATIONS

Combined Search and Examination Report under Sections 17 and 18(3), UKIPO, Application No. GB2106144.5, dated Oct. 25, 2021.
International Search Report and Written Opinion of the International Searching Authority, International Application No. PCT/US2021/041547, dated Nov. 2, 2021.
International Search Report and Written Opinion of the International Searching Authority, International Application No. PCT/US2021/041918, dated Nov. 10, 2021.
International Search Report and Written Opinion of the International Searching Authority, International Application No. PCT/US2021/041544, dated Nov. 10, 2021.
Definition of "Parallel", The New IEEE Standard Dictionary of Electrical and Electronics Terms, 5th Ed., p. 914 (1993).
David Halliday et al., Fundamentals of Physics, 5th Ed., p. 681 (1997).

\* cited by examiner

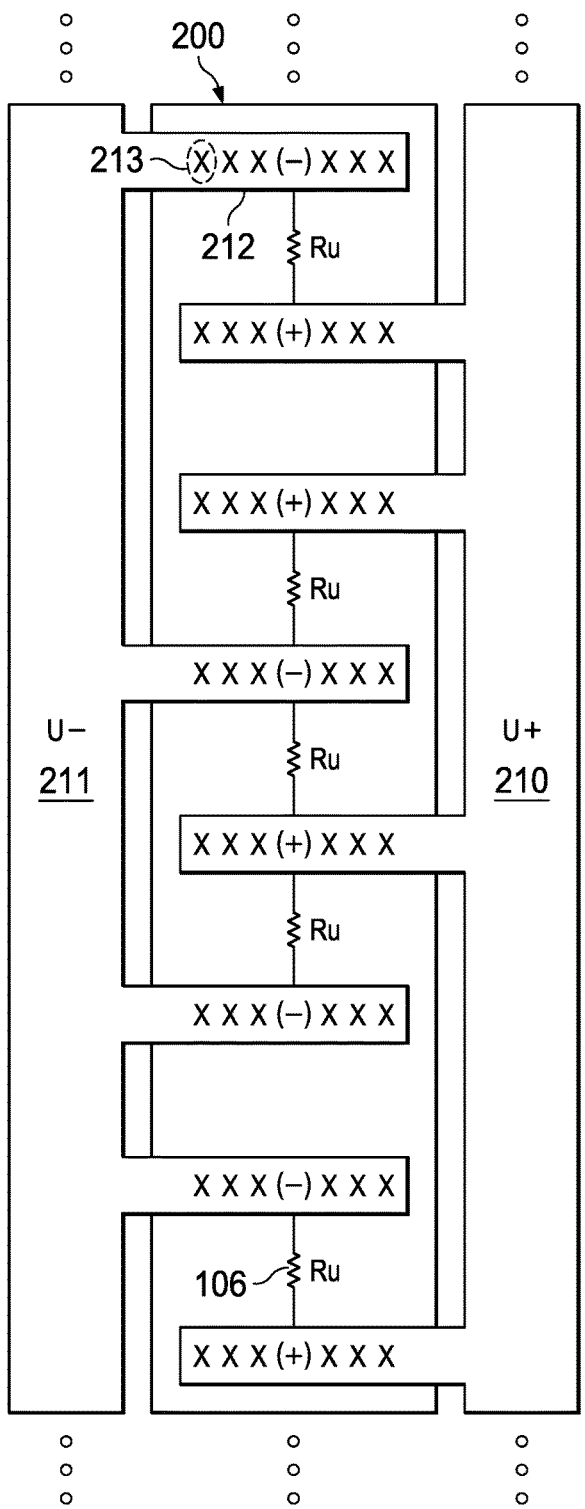
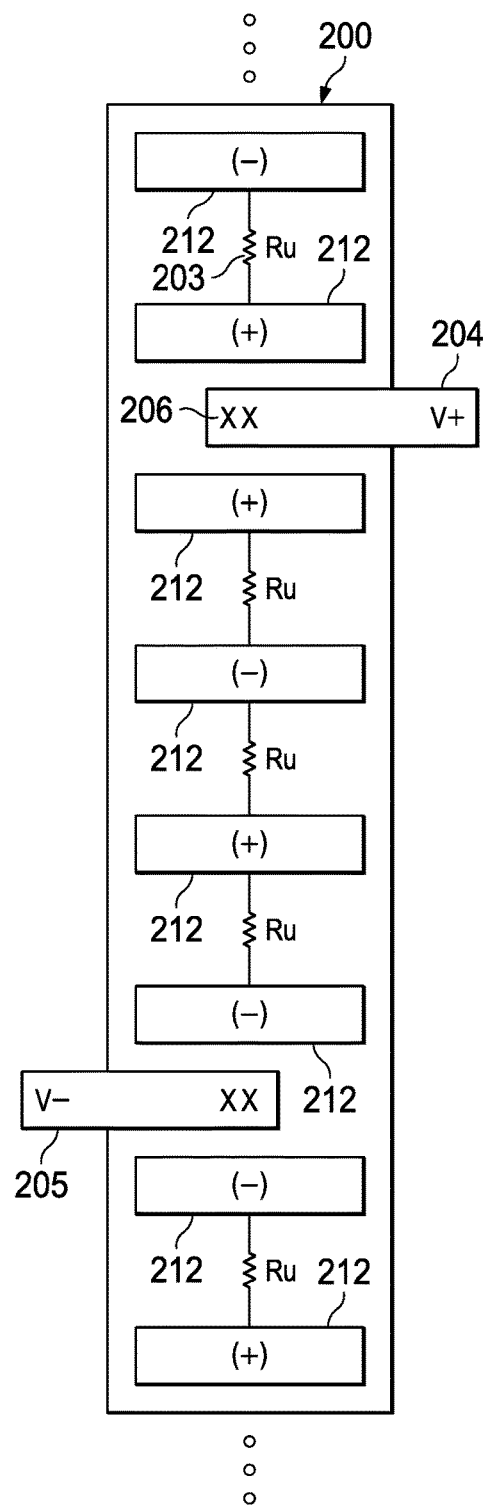
FIG. 2A                                   FIG. 2B

SENSE RESISTOR AND METHOD FOR FORMING SAME

RELATED APPLICATION

The present disclosure claims priority to U.S. Provisional Patent Application Ser. No. 63/027,576, filed May 20, 2020, which is incorporated by reference herein in its entirety.

FIELD OF DISCLOSURE

The present disclosure relates in general to integrated circuit fabrication, and more particularly, to fabrication of a sense resistor for use in an integrated circuit.

BACKGROUND

Semiconductor device fabrication is a process used to create integrated circuits that are present in many electrical and electronic devices. It is a multiple-step sequence of photolithographic, mechanical, and chemical processing steps during which electronic circuits are gradually created on a wafer made of semiconducting material. For example, during semiconductor device fabrication, numerous discrete circuit components, including transistors, resistors, capacitors, inductors, and diodes may be formed on a single semiconductor die.

For accurately sensing high currents (e.g., on the order of 1 A to 100 A) in embedded or integrated circuits, low-resistance four-terminal sense resistors are often necessary, on the order of 1-10 m$\Omega$. Such low resistances may contribute negligible power loss to a system downstream of the sense resistor. In a standard four-terminal sense resistor, the current conduction terminals are separated from the voltage measurement terminals. Realizing low-impedance sense resistors that couple to integrated circuits in a wafer-level chip-scale package may provide for significant reduction in a circuit area on a printed circuit board.

In a laminated process stack used to create an integrated circuit, a resistor may be implemented as a resistive sheet layer (e.g., polycrystalline, tantalum nitride, etc.) underneath an upper metal layer that forms the resistor contacts. To realize a low impedance resistor (1-10 m$\Omega$), this scheme may be expanded by placing multiple higher-resistance units in parallel. The resulting structure may have a very long (1 mm-5 mm) and thin (10 um-20 um) aspect ratio (e.g., a high aspect ratio), causing parasitic metal resistance along a high-current shorting bar that comprises each current conduction terminal to approach the resistance of the overall sense resistor. For example, parasitic metal routing impedance of 1 m$\Omega$ to 3 m$\Omega$ per terminal is possible in a current path for a 3 m$\Omega$ sensed resistance. This parasitic impedance introduces the possibility of non-uniformity in current density along the width of a sense resistor structure. The potential distribution on a metal layer of an integrated circuit may lead to a spatial gradient in current density that may cause errors in a sensed voltage across a sense resistor.

SUMMARY

In accordance with the teachings of the present disclosure, certain disadvantages and problems associated with fabrication of sense resistors in an integrated circuit may be reduced or eliminated.

In accordance with embodiments of the present disclosure, an apparatus may include a sense resistor comprising a plurality of parallel-coupled resistor elements, a plurality of positive voltage sense points, and a plurality of negative voltage sense points. A first passive combination network may be configured to combine the plurality of positive voltage sense points into a single positive sense terminal and a second passive combination network may be configured to combine the plurality of negative voltage sense points into a single negative sense terminal. The first passive combination network and the second passive combination network may be arranged such that a sense voltage may be measured between the single positive sense terminal and the single negative sense terminal and a dependence of the sense voltage on a variation in current density in the parallel-coupled resistor elements is minimized.

In accordance with embodiments of the present disclosure, a method may include forming a sense resistor including a plurality of parallel-coupled resistor elements, a plurality of positive voltage sense points and a plurality of negative voltage sense points. The method may also include combining the plurality of positive voltage sense points into a single positive sense terminal with a first passive combination network and combining the plurality of negative voltage sense points into a single negative sense terminal using a second passive combination network. The method may further include arranging the first passive combination network and the second passive combination network such that a sense voltage may be measured between the single positive sense terminal and the single negative sense terminal and a dependence of the sense voltage on a variation in current density in the parallel-coupled resistor elements is minimized.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 2A and 2B illustrate selected portions of a top-down plan view of an example resistor element implemented using a laminated process stack, in accordance with embodiments of the present disclosure;

DETAILED DESCRIPTION

Figure 1:
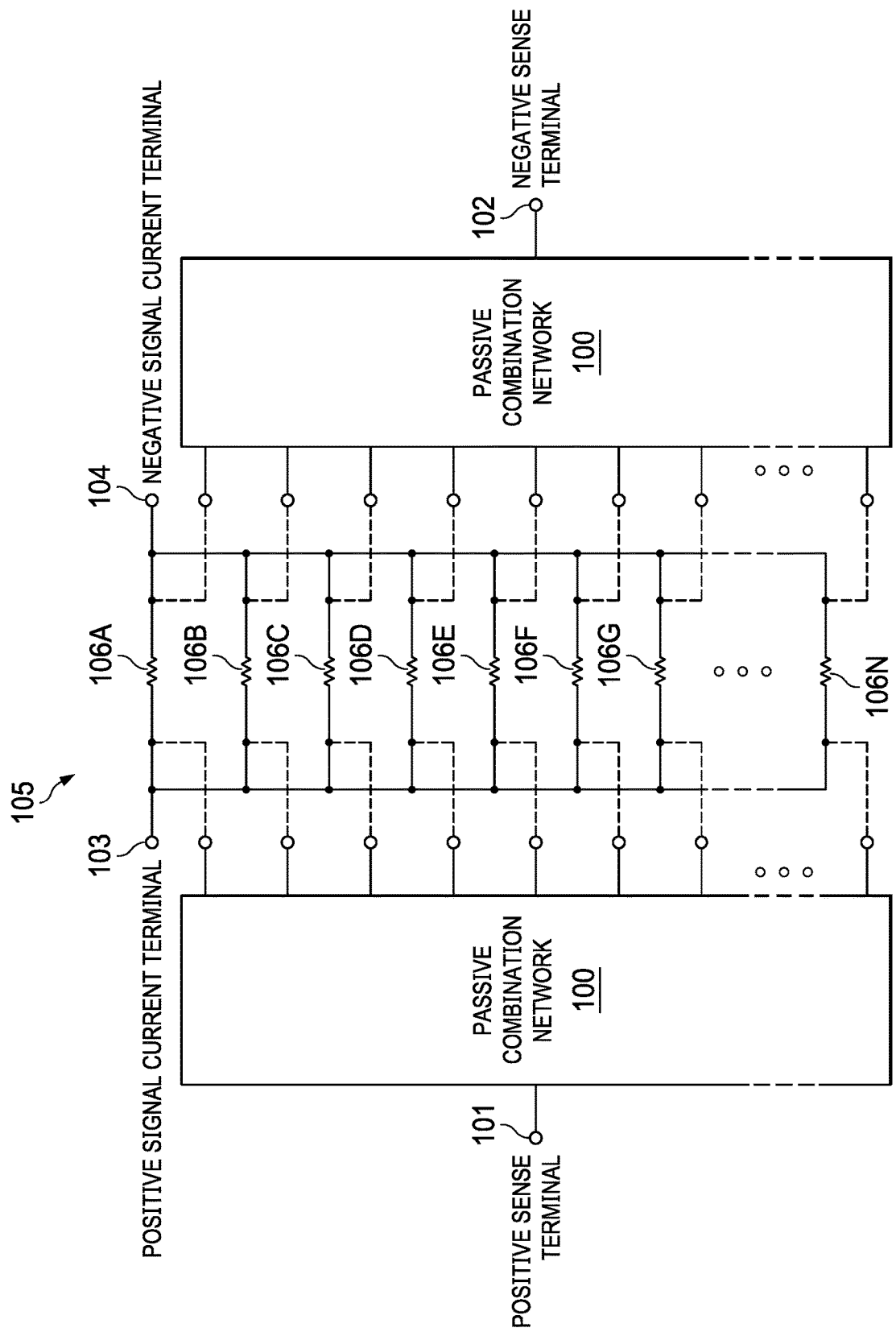
FIG. 1 illustrates a block diagram of an example sense resistor, in accordance with embodiments of the present disclosure.

FIG. 1 illustrates a block diagram of a sense resistor 105, in accordance with embodiments of the present disclosure. As shown in FIG. 1, sense resistor 105 may be implemented by a plurality of resistor elements 106 (e.g., 106A-N) coupled to one another in parallel. In operation, electrical current may flow through sense resistor 105 from a positive signal current terminal 103 to a negative signal current terminal 104, which may generate an electrical voltage across sense resistor 105 that may be measured at positive sense terminal 101 and negative sense terminal 102 to estimate the electrical current.

As also shown in FIG. 1, a passive combination network 100 may be coupled between positive sense terminal 101 and each resistor element 106, and a similar passive combination network 100 may be coupled between negative sense terminal 102 and each resistor element 106. Due to the high aspect ratio of sense resistor 105 (width must be greater than length) and/or varied current draw from current-consuming components downstream of sense resistor 105, signal current through separate or distant regions of sense resistor 105 may vary in magnitude. Thus, to accurately sense voltage across sense resistor 105, multiple voltage sense points (e.g., at a plurality of the resistor elements 106) may be used. To maintain high signal fidelity in the voltage measured across positive sense terminal 101 and negative sense terminal 102 in response to signal current, a gain from each individual voltage tap to a combined sense voltage terminal (e.g., positive sense terminal 101, negative sense terminal 102), should ideally be equal. Accordingly, each passive combination network 100 may be configured to provide for the gain from each individual voltage tap to a combined sense voltage terminal to be approximately equal.

Alternatively, in the case that the separate resistor elements 106 vary in resistance, a gain of each of the independent voltage sense points in the parallel array of resistor elements 106 may be varied such that the combined voltage sense points (e.g., positive sense terminal 101, negative sense terminal 102) represent the correct total electrical current multiplied by the total resistance of the parallel array of resistor elements 106. Accordingly, each passive combination network 100 may be configured to provide for such gain relationship.

FIGS. 2A and 2B illustrate selected portions of a top-down plan view of a resistor element 106 implemented using a laminated process stack, in accordance with embodiments of the present disclosure. FIG. 2A depicts multiple metal fingers 212 of a first metallization layer (e.g., aluminum, copper, or other suitable metal) extending from respective shorting bars 210 and 211 of the first metallization layer, wherein each metal finger 212 may contact an underlying resistive layer 200 through vias 213 arranged along the length of each metal finger 212. Shorting bars 210 and 211 may correspond to positive signal current terminal 103 and negative signal current terminal 104, respectively.

FIG. 2B depicts a similar view to that of FIG. 2A, but without shorting bars 210 and 211 and vias 213 removed and a positive sense tap 204 and a negative sense tap 205 added, for clarity of exposition. Positive sense tap 204 and negative sense tap 205 may be formed in a metallization layer (e.g., aluminum, copper, or other suitable metal) and may each be contacted to underlying resistive layer 200 through vias 206. Each of positive sense tap 204 and negative sense tap 205 may be located between equipotential current-carrying metal fingers 212. Positive sense tap 204 may couple to positive sense terminal 101 via a passive combination network 100 and negative sense tap 205 may couple to negative sense terminal 102 via another passive combination network 100.

If current density through each resistor element 106 in the structure shown in FIGS. 2A and 2B is equal, then every positive current-carrying metal finger 212 should be equipotential and every negative current-carrying metal finger 212 should be equipotential in an ideal case. In such a case, sensing the voltage across the entire structure of sense resistor 105 may require one positive sense tap 204 and one negative sense tap 205. However, because current density across the overall structure of sense resistor 105 may not be constant, multiple tap points may be used across the width of sense resistor 105 and averaged together to derive a correct average sensed voltage across the overall structure of sense resistor 105, as described in greater detail below. Such sense points may be spaced equidistant from one another to realize uniform spatial sampling of a non-uniform current density along the structure width. In this way, a spatially-linear sense resistor 105 may be realized.

Figure 3:
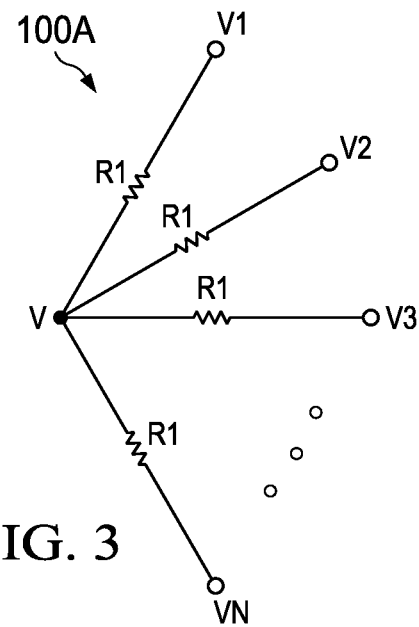
FIG. 3 illustrates an example passive combination network using a star connection, in accordance with embodiments of the present disclosure.

FIG. 3 illustrates an example passive combination network 100A using a star connection, in accordance with embodiments of the present disclosure. In some embodiments, passive combination network 100A may be used to implement passive combination network 100 depicted in FIG. 1. As shown in FIG. 3, each of multiple voltage sense points (e.g., positive sense taps 204, negative sense taps 205) having sensed voltages V1, V2, V3, . . . . , VN may be "star" connected or Kelvin connected via a respective matched resistance R1 (e.g., resistance of metal trace) to a single physical point having averaged voltage V. However, area constraints for metal routing may make passive combination network 100A difficult to achieve in a practical sense.

Figure 4:
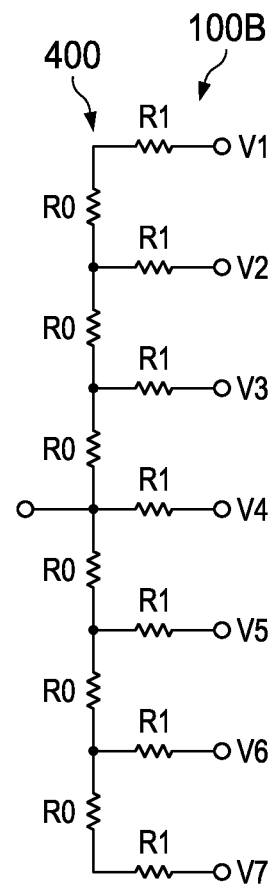
FIG. 4 illustrates an example passive combination network using a low-impedance shorting bar composed of a plurality of routing segments, in accordance with embodiments of the present disclosure.

FIG. 4 illustrates an example passive combination network 100B using a low-impedance shorting bar 400 (e.g., a metal trace) composed of a plurality of routing segments each having resistance R0, in accordance with embodiments of the present disclosure. In some embodiments, passive combination network 100B may be used to implement passive combination network 100 depicted in FIG. 1. As shown in FIG. 4, shorting bar 400 may be contacted by a plurality of tap lines from respective voltage sense points (e.g., positive sense taps 204, negative sense taps 205) having sensed voltages V1, V2, V3, V4, V5, V6, and V7, wherein individual resistances R1 of such tap lines may be greater than resistance R0. If resistance R0 is significantly less than resistance R1, then the structure of passive combination network 100B may approach an ideal case.

In some applications, it may be desirable to keep a path impedance from positive sense terminal 101 to negative sense terminal 102 as low as possible (e.g., on the order of 1 m$\Omega$ to 10$\Omega$). In such a case, creating the ideal case of resistance R0 significantly less than resistance R1 may not be advantageous as it requires resistance R1 to be relatively high-impedance. Thus, in lieu of passive combination network 100B, either of passive combination network 100C or passive combination network 100D described below may be used instead.

Figure 5:
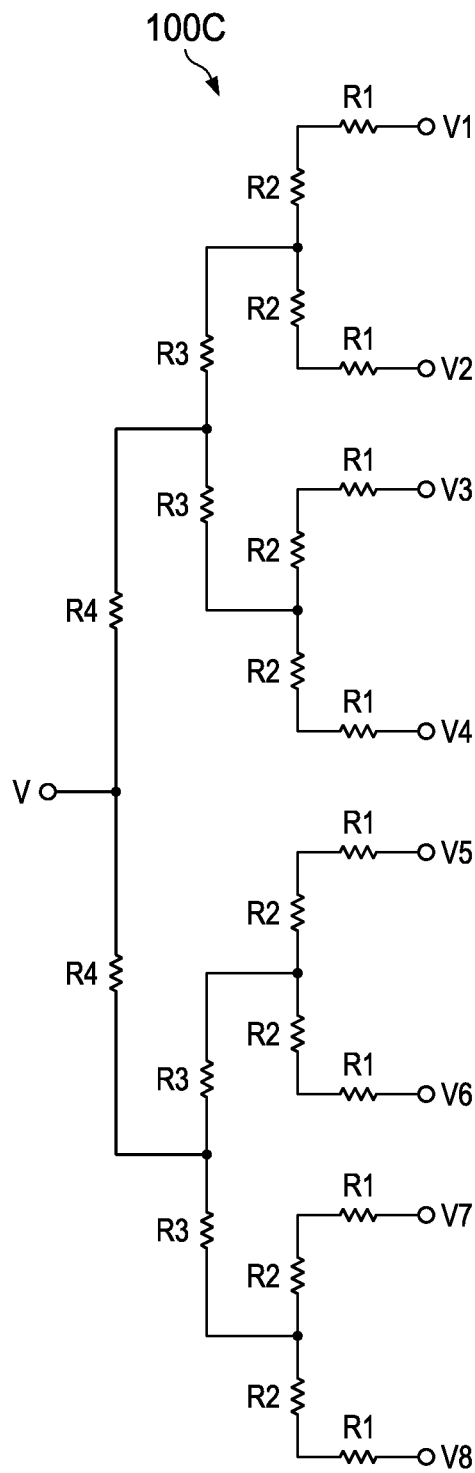
FIG. 5 illustrates an example passive combination network using a binary tree structure, in accordance with embodiments of the present disclosure.

FIG. 5 illustrates an example passive combination network 100C using a binary tree structure, in accordance with embodiments of the present disclosure. In some embodiments, passive combination network 100C may be used to implement passive combination network 100 depicted in FIG. 1. In passive combination network 100C, each branch of the binary tree structure may have equal impedance from trunk (e.g., electrical node for voltage V) to leaf (e.g., electrical nodes for V1, V2, V3, etc.).

Figure 6:
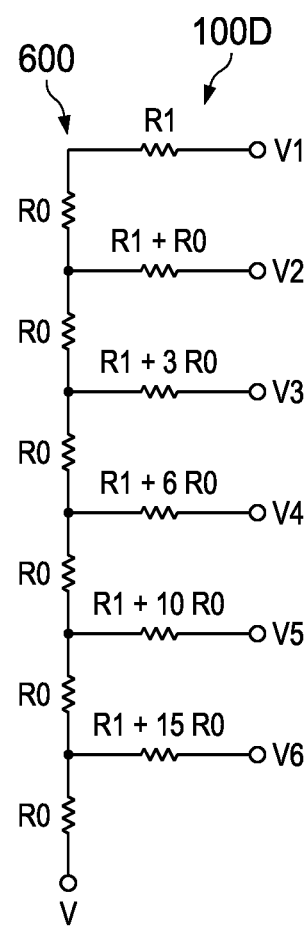
FIG. 6 illustrates an example passive combination network using ballast resistors in some or all of its routing segment, in accordance with embodiments of the present disclosure.

FIG. 6 illustrates an example passive combination network 100D using ballast resistors in some or all of its routing segment, in accordance with embodiments of the present disclosure. In some embodiments, passive combination network 100D may be used to implement passive combination network 100 depicted in FIG. 1. In passive combination network 100D, a resistance from an individual voltage sense point (e.g., V1, V2, V3, etc.) to a shorting bar 600 (e.g., comprising segments with resistances R0) may be varied so that each tap has an approximately equal gain to the combined output at the electrical node having voltage V. Accordingly, passive combination network 100D may have the advantage that a combined voltage output may be tapped from any location along shorting bar 600, with ballast resistors X*R0 of the various routing segments varied accordingly. In passive combination network 100D, a calculation for a ballasting resistor based on a tap location of shorting bar may be given by:

$$R_{tap}[m] = R1 + R0 \sum_{n=0}^{m} n$$

where R0 is a resistance of one segment of shorting bar 600, m is an integer number of segments that separate a target tap from a tap most distant from a combined tap (i.e., electrical node having voltage V), and R1 is a resistance of the tap most distant from the combined tap.

In an integrated circuit solution build with a laminated fabrication process, metallization routing layers (e.g., copper, aluminum, other suitable metal) may be used to implement the various resistances of passive combination networks 100A, 100B, 100C, and 100D. By matching the length and width of individual metal traces, matching resistances (e.g., resistances R1 of passive combination networks 100A, 100B, 100C, and 100D) may be realized. In passive combination networks 100B and 100D utilizing a shorting bar (e.g., 400 or 600), resistances R0 may be seen as undesirable, so lower-resistivity metal (e.g., higher metallization layer metals with greater thickness) may be used to implement routing segments of passive combination networks 100B and 100D.

For a passive combination network like passive combination network 100D where ballast resistors are used, care may be taken to ensure that segments of shorting bar 600 scale geometrically with the multiples of resistance R0 used for ballasting of the metal traces. In this case, it may be advantageous to use the same material for resistance R0 in shorting bar 600 and the ballasting resistors. For an integrated process, the same metal routing layer used for shorting bar 600 may be used to form the ballasting resistors such that layer-to-layer process variation does not cause error in the geometric scaling between segments of resistance R0 in shorting bar 600 and the ballasting resistors.

Although the foregoing contemplates a sense resistor 105 with a single set of passive combination networks 100 (e.g., a passive combination network 100 at positive sense terminal 101 and a passive combination network 100 at negative sense terminal 101), in some embodiments, a sense resistor 105 may comprise multiple (e.g., two or more) sets of passive combination networks 100. In such embodiments, the structures and topologies of the multiple sets of passive combination networks 100 may be the same, but each passive combination network 100 may combine separate tap instances.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An apparatus comprising:
a sense resistor comprising:
  a plurality of parallel-coupled resistor elements, coupled between a first electrical node and a second electrical node;
  a plurality of positive voltage sense points, each positive voltage sense point configured to sense a first voltage at the first electrical node; and
  a plurality of negative voltage sense points, each negative voltage sense point configured to sense a second voltage at the second electrical node;
a first passive combination network configured to combine the plurality of positive voltage sense points into a single positive sense terminal; and
a second passive combination network configured to combine the plurality of negative voltage sense points into a single negative sense terminal;
wherein the first passive combination network and the second passive combination network are arranged such that:
  a sense voltage is measurable between the single positive sense terminal and the single negative sense terminal; and
  a dependence of the sense voltage on a variation in current density in the parallel-coupled resistor elements is minimized.

2. The apparatus of claim 1, wherein at least one of the first passive combination network and the second passive combination network is implemented using a binary tree network.

3. The apparatus of claim 1, wherein at least one of the first passive combination network and the second passive combination network comprises:
  a plurality of tap lines, each tap line of the plurality of tap lines extending from a respective positive voltage sense point or negative voltage sense point; and
  a shorting bar electrically contacted to each of the plurality of tap lines opposite the respective positive voltage sense point or negative voltage sense point, such that a sense terminal comprising one of the single positive sense terminal and the single negative sense terminal is contacted to the shorting bar.

4. The apparatus of claim 3, wherein the shorting bar comprises a plurality of routing segments formed from a metal routing layer.

5. The apparatus of claim 4, wherein each tap line of the plurality of tap lines implements a respective ballast resistor formed from the metal routing layer used to form the plurality of routing segments.

6. The apparatus of claim 5, wherein the sense terminal is contacted to the shorting bar at any location along the shorting bar.

7. The apparatus of claim 5, wherein the sense terminal is contacted to the shorting bar at an end of the shorting bar.

8. The apparatus of claim 1, further comprising:
  a third passive combination network similar in structure to the first passive combination network and configured to combine the plurality of positive voltage sense points into the single positive sense terminal; and
  a fourth passive combination network similar in structure to the second passive combination network configured to combine the plurality of negative voltage sense points into the single negative sense terminal.

9. A method comprising:
forming a sense resistor comprising:
  a plurality of parallel-coupled resistor elements, coupled between a first electrical node and a second electrical node;
  a plurality of positive voltage sense points, each positive voltage sense point configured to sense a first voltage at the first electrical node; and
  a plurality of negative voltage sense points, each negative voltage sense point configured to sense a second voltage at the second electrical node;
combining the plurality of positive voltage sense points into a single positive sense terminal with a first passive combination network;
combining the plurality of negative voltage sense points into a single negative sense terminal using a second passive combination network; and
arranging the first passive combination network and the second passive combination network such that:
  a sense voltage is measurable between the single positive sense terminal and the single negative sense terminal; and
  a dependence of the sense voltage on a variation in current density in the parallel-coupled resistor elements is minimized.

10. The method of claim 9, further comprising implementing at least one of the first passive combination network and the second passive combination network using a binary tree network.

11. The method of claim 9, wherein at least one of the first passive combination network and the second passive combination network comprises:
  a plurality of tap lines, each tap line of the plurality of tap lines extending from a respective positive voltage sense point or negative voltage sense point; and
  a shorting bar electrically contacted to each of the plurality of tap lines opposite the respective positive voltage sense point or negative voltage sense point, such that a sense terminal comprising one of the single positive sense terminal and the single negative sense terminal is contacted to the shorting bar.

12. The method of claim 11, wherein the shorting bar comprises a plurality of routing segments formed from a metal routing layer.

13. The method of claim 12, wherein each tap line of the plurality of tap lines implements a respective ballast resistor formed from the metal routing layer used to form the plurality of routing segments.

14. The method of claim 13, wherein the sense terminal is contacted to the shorting bar at any location along the shorting bar.

15. The method of claim 13, wherein the sense terminal is contacted to the shorting bar at an end of the shorting bar.

16. The method of claim 9, further comprising:
  combining the plurality of positive voltage sense points into the single positive sense terminal using a third passive combination network similar in structure to the first passive combination network; and
  combining the plurality of negative voltage sense points into the single negative sense terminal using a fourth passive combination network similar in structure to the second passive combination network.

* * * * *